United States Patent [19]

Millaway et al.

[11] Patent Number: 4,550,291
[45] Date of Patent: Oct. 29, 1985

[54] NOISE-FREE, DIE AREA EFFICIENT CASCODE CIRCUIT

[75] Inventors: Steven D. Millaway; Jerald G. Graeme, both of Tucson, Ariz.

[73] Assignee: Burr-Brown Corporation, Tucson, Ariz.

[21] Appl. No.: 538,377

[22] Filed: Oct. 3, 1983

[51] Int. Cl.[4] ............................................. H03F 3/16
[52] U.S. Cl. .................................. 330/277; 330/288; 330/300; 330/311
[58] Field of Search ............... 330/277, 288, 300, 311, 330/293, 253, 257

[56] References Cited

U.S. PATENT DOCUMENTS 3,546,614 12/1970 Lochstampfer .................. 330/290
4,060,770 11/1977 Schade, Jr. ...................... 330/253

OTHER PUBLICATIONS

Wyland, "FET Cascode Technique Optimizes Differential Amplifier Performance", *Electronics*, Jan. 18, 1971, pp. 81–84.
Hoefflinger, et al., "Some Design Aspects of M.O.S.L.-S.I. Operational Amplifiers", *Solid-State and Electron Devices*, vol. 3, No. 2, Mar. 1979, pp. 33–40.

Primary Examiner—James B. Mullins
Attorney, Agent, or Firm—Weiss & Holloway

[57] ABSTRACT

In a circuit in which a common-source junction field effect transistor (JFET) is cascoded with a JFET element, current diversion or division circuits are used to divert a majority of the current passing through the input amplifier stage so that it bypasses the cascode FET without compromising the primary circuit function. The bypassing function is achieved by a current mirror, a current mirror-like circuit, or similar devices such as current sources, current splitters and the like and the circuits may be ratioed to more precisely control the bypass current by the use of emitter area scaling, ratioed emitter degeneration resistors, or both. The resultant cascode circuit is relatively noise-free and can easily be implemented into a monolithic integrated circuit without using excess or unrealistic die areas. Another advantage is that the current dividers or diverters make it easier to bias the cascode FET and a further advantage is that the same techniques can be applied with other than JFET amplifier elements, and with other amplifier devices, differential stages, plural stages, and the like.

33 Claims, 4 Drawing Figures

NOISE-FREE, DIE AREA EFFICIENT CASCODE CIRCUIT

BACKGROUND OF THE INVENTION

1. Field of the Invention

The present invention relates to a noise-free cascode circuit which is compatible with monolithic integrated circuit realization, and more particularly to a cascode circuit wherein the cascode element is a common-source junction field effect transistor which renders the circuit virtually noise-free and a current divider means for bypassing the majority of the current flowing in the input stage past the cascode JFET for significantly reducing the die area required for implementing the circuit in a monolithic integrated circuit.

2. Description of the Prior Art

The cascode circuit or sub-circuit employing two bipolar transistors has been in use for many years. The principal attributes of the cascode configuration are that the output resistance is very high and that no high frequency feedback occurs from the output back to the input through the parasitic capacitance or collector-base capacitance of a transistor such as occurs in the common-emitter configuration or the like. The high input impedance that is attainable particularly useful in obtaining power supply desensitization in bias reference supplies and in achieving large amounts of voltage gain in a single amplifying stage with an active transistor load.

Another significant problem with single state amplifier circuits and the like is that capacitance limits the speed at which voltages within a circuit can swing, owing to the finite driving impedance or current. When a capacitance is driven by a finite source resistance, RC exponential charging behavior is seen, whereas a capacitance driven by a current source leads to slew-rate-limited wave forms. As general guidance, reducing the source impedance and load capacitances and increasing the drive currents within a circuit will speed things up. However, there are some subtleties connected with feedback capacitance and input capacitance which deserve a look. The most serious of the problems is that of junction capacitance. The output capacitance $C_L$ forms a time constant with the output resistance $R_L$ to produce a rolloff starting at some frequency $R = \frac{1}{2}\pi R_L C_L$. The same is true for the input capacitance in combination with the source impedance $R_s$. The collector-base capacitance $C_{cb}$ is another matter. The amplifier has some overall voltage gain $G_v$ so even a small voltage wiggle at the input results in a greatly magnified wiggle and inverted output of the collector. This means that that signal source sees a current through $C_{cb}$ that is equal to an output voltage gain plus 1 $(G_v+1)$ times as large as if the collector-base capacitance $C_{cb}$ were connected from base to ground such that for the purpose of input rolloff frequency calculations, the feedback capacitance behaves like a capacitor of value $C_{cb}(G_v+1)$ where $G_v$ is the overall voltage gain of the amplifier. This effective increase of $C_{cb}$ is known as the Miller effect. It often dominates the rolloff characteristic of amplifiers because a typical feedback capacitance will look like many times its actual value to ground. There are several methods available to minimize the effect of the Miller effect and one of the most effective methods found to date is to use a cascode element in the circuit. Still another problem in prior art circuits including those of a typical single stage amplifier include the problem that the addition of any device in the signal path between the input and output adds noise and this is true of the common cascode element as well. Therefore, even if a cascode element is added to reduce the Miller effect, a substantial increase in noise may occur to offset the desirability thereof.

However, even cascode circuits wherein a JFET transistor is used for both the signal amplifier stage and the cascode element, considerable problems exist particularly where it is desirable to be able to reduce the circuit combination or sub-circuit to a monolithic integrated circuit since the JFET generally requires a very large and relatively inefficient die area in order to carry the required input current thus rendering it virtually uneconomical to reduce the JFET cascode combination to a monolithic integrated realization.

These and the other problems of the prior art are solved in the circuits of the present invention which provide an extremely simple means for producing a noise free cascode circuit or subcircuit capable of being reliably and efficiently implemented as a monolithic integrated circuit.

SUMMARY OF THE INVENTION

The present invention teaches a virtually noise-free cascode amplifier circuit or sub-circuit capable of being implemented in realistic die areas or sizes in monolithic integrated circuits. In the preferred embodiment an input junction field effect transistor JFET amplifier stage provides a circuit input and a JFET cascode stage operatively coupled between the input JFET amplifier stage and the circuit output for substantially eliminating all circuit noise. A current-diverting means is provided for dividing the current into at least two paths and diverting the majority of the circuit current around the JFET cascode element for significantly reducing the size of the die area required to implement the cascode JFET in a monolithic integrated circuit thereby making the realization thereof possible.

The diverting means may include a current mirror operatively coupled in feedback with the cascode JFET; a current mirror-like circuit operatively coupled in the current source of the cascode JFET to serve as a current divider for splitting the current into at least two paths with the greater portion of the current bypassing the cascode JFET to enable minimum die area required for monolithic integrated circuit implementation current source means for directing the majority of the current around the JFET cascode stage; and current splitting means for forming two or more paths to bypass the JFET cascode transistor with the majority of the current to ensure that a relatively small die area is required so that the circuit can be implemented as a monolithic integrated circuit.

The diverting means may also include a means for ratioing the current flow including an emitter area scaling means; the insertion of ratioed emitter degeneration resistors; or both.

The circuit also contemplates a method of eliminating noise from a cascode amplifier having at least a bipolar transistor cascode element including substituting a JFET cascode element for the bipolar cascode element and coupling the JFET cascode element between the input amplifier stage and the circuit output. The step of inserting a JFET as the input amplifier stage is also included as is the step of diverting current from the JFET input so that the majority thereof bypasses the JFET cascode element to enable the JFET cascode element to be implemented in monolithic integrated circuit technology in a realistic die area.

A method is also contemplated for improving a cascode amplifier circuit by utilizing a number "x" amplifier stages and inserting a JFET cascode element into each stage and then diverting current through each of the "x" stages substantially bypassing the JFET cascode elements to reduce the required die area and enable the circuit to be implemented in monolithic integrated circuit technology. Likewise, this method may include the step of ratioing the currents in the diverting step and the like.

The present invention enables (1) the construction of a cascode circuit or sub-circuit utilizing a JFET cascode element to render the circuit relatively noise-free; (2) enables the use of the JFET cascode element even though such with normally would require too large a die area to permit integration by diverting the majority of the current around the JFET cascode element thereby enabling the circuit to be implemented in monolithic integrated circuit form; and (3) means for combining the current diverters with JFET cascode to provide an ease of biasing to the point where the gate-source voltage of the cascode JFET can be raised to a level such that it along provides adequate voltage across the amplifier device for normal operation.

Other advantages and meritorious features of the present invention will be more fully understood from the following description of the drawings and the preferred embodiment, the appended claims and the drawings which are described hereinbelow:

DESCRIPTION OF THE PREFERRED EMBODIMENT

Figure 1:
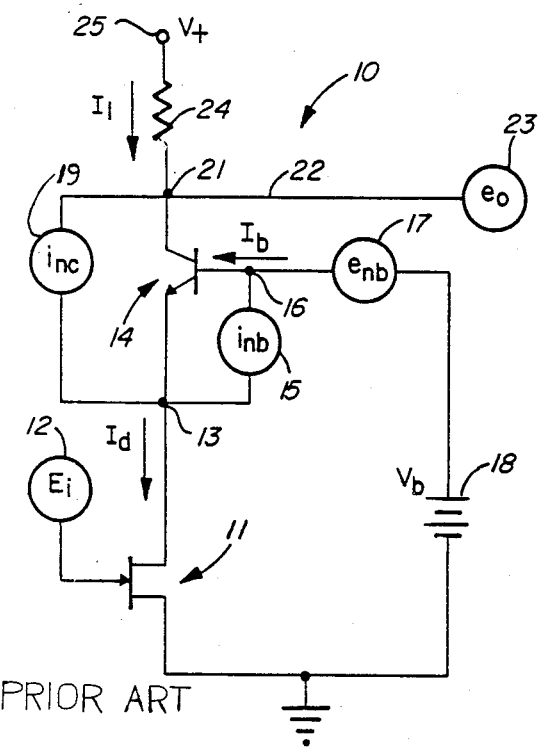
FIG. 1 is a Prior Art cascode circuit including an input stage having a JFET and a cascode element comprising a bipolar transistor.

The cascode circuit connection of FIG. 1 is well recognized for several benefits it provides in improving output signal and bias voltages from an amplifier stage. However, it is also known that the addition of any device in the signal path between the circuit input and the circuit output adds noise and this is also true of the common cascode element. However, the common cascode element is necessary in many circuits in order to eliminate the Miller effect, to provide a high output resistance, and to ensure that no high frequency feedback occurs from the output to the input through the parasitic capacitance. FIG. 1 shows a Prior Art first cascode circuit 10 having a common-source N-channel junction field effect transistor JFET 11 serving as a single stage input amplifier. The gate electrode of JFET 11 is connected directly to the circuit input $E_i$ designated by reference number 12 while the source is connected directly to ground. The drain electrode of JFET 11 is connected to node 13. A NPN bipolar transistor 14 is cascoded with the JFET 11 as hereinafter described. The emitter electrode of transistor 14 is connected directly to node 13 while node 13 is connected through the current source $i_{nb}$ 15 to a node 16. Node 16 is connected directly to the base of transistor 14 and to the input of a voltage source $e_{nb}$ 17 whose opposite terminal is connected to the bias voltage source $V_b$ whose opposite terminal is grounded. The collector of transistor 14 is connected directly to node 21 and node 13 is connected through the current source $i_{nc}$ 19 to node 21. Node 21 is connected via output lead 22 to the circuit output $E_o$ designated by reference number 23 and through a load resistor 24 to a source of potential $V+$ 25.

In FIG. 1, the source of potential $V+$ is designated by reference numeral 25, the source of bias potential is designated $V_b$ and the current flow is represented by $I_l$ through the load resistor 24, $I_b$ through node 16 to the base of transistor 14, and current $I_d$ flowing from node 13 to the drain electrode of JFET 11. The output voltage $E_o$ is supported by the collector-base junction of the bipolar transistor 14 instead of the drain-gate junction of the amplifier device JFET 11. Consequently, the input capacitance and input leakage current can be greatly reduced over the simple common-source circuit. To determine the noise contribution of the cascode element comprising the NPN transistor 14, its noise sources are included in FIG. 1 and an analysis shows that the current reaching the load resistor 24 is given by the equation:

$$I_l = I_d - I_b + i_{nb} + e_{nb}/R_{ol} \approx I_d - I_b + i_{nb}$$

where $R_{ol}$ is the output resistance of the JFET transistor 11. The noise of the bipolar transistor 14 base current is given by $i_{nb}$ and remains as a significant term in the load current and thus degrades the noise performance of the Prior Art circuit of FIG. 1.

Figure 2:
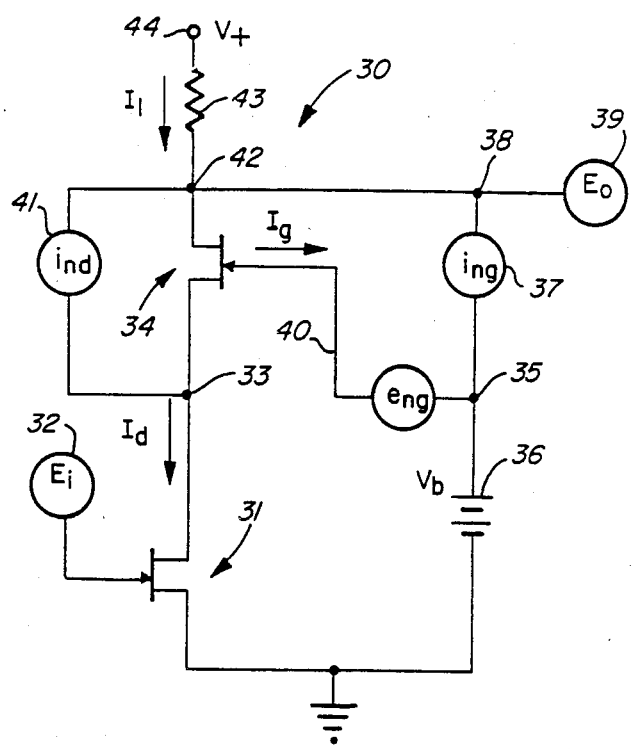
FIG. 2 is an improved cascode circuit providing a virtually noiseless cascode stage including a JFET input stage and a JFET cascode element.

Since it is an object of the present invention to provide a virtually noiseless or noise-free cascode circuit or sub-circuit that is die area efficient, the use of an n-channel JFET transistor for the cascode element was found to essentially eliminate the noise error described above as will be shown with reference to FIG. 2. FIG. 2 shows a second cascode circuit or sub-circuit 30 having a single input amplifier stage comprising a first n-channel JFET 31 and a cascode element comprising a second n-channel JFET 34. The gate electrode of JFET 31 is directly connected to receive the input signal $E_i$, designated by reference numeral 32, and the source electrode is connected directly to ground. The drain electrode of JFET 31 is connected directly to node 33 and node 33 is connected directly to the source electrode of the cascode JFET 34. The gate electrode of JFET 34 is connected via lead 40 to node 35. Node 35 is connected to the positive terminal of a source of bias potential $V_b$ designated by reference numeral 36 whose negative terminal is connected directly to ground. A current source $i_{ng}$ 37 is connected between node 35 and an output node 38, as hereinafter described. The junction of the source electrode of JFET 34 and the drain electrode of JFET 31 taken at node 33 is connected through the current source $i_{nd}$ designated by reference numeral 41 to node 42 which is also connected directly to the drain electrode of JFET 34. Node 42 is connected directly to node 38 which in turn is connected directly to the voltage circuit output $E_o$ designated by reference numeral 39. Simultaneously, the node 42 is connected to one terminal of a load resistor 43 whose opposite terminal is connected to a source of potential V+ designated by reference numeral 44.

Therefore, the contribution of the cascode element JFET 34 to the circuit 30 must be analyzed to determine its effect upon noise. The FIG. 2 load current can be given by the equation $$I_l = I_d + I_g + i_{ng} + e_{ng}/R_{ol} \approx I_d$$

where $I_l$ is again the current through the load resistor 43, $I_g$ is the current flowing from the gate of the JFET 34, and $I_d$ is the drain current JFET 34. However, in this case the comparable noise introduced into the load current by the cascode element is simply that of the cascode gate leakage current $I_g$ which is negligible in comparison with the current noise of $I_d$ and hence it is established that the use of a JFET cascode stage will substantially eliminate all current noise from the cascode circuit.

The disadvantage, however, of using the JFET 34 as a cascode element in monolithic integrated circuits is that of increased die area. Because the cascode must conduct the same level of current as the amplifying device or JFET transistor 31, its die area must typically be about the same or in many cases even larger. Very large JFET areas are also required where high gain, low noise amplification is desired and therefore straightforward replacement of a bipolar transistor cascode device with a JFET transistor cascode device would normally have significant die area consequences so as to render the implementation of the circuit into a monolithic integrated circuit form uneconomical. To overcome this limitation, the modified cascode circuit 50 of FIG. 3 was devised.

Figure 3:
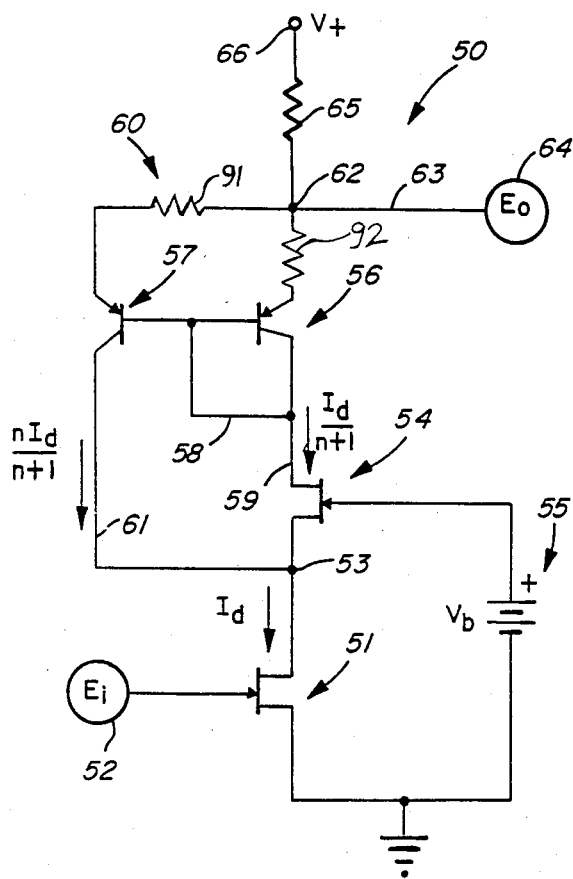
FIG. 3 is a first modified cascode circuit including a JFET input amplifier stage, a JFET cascode element, and a current mirror stage.

In FIG. 3, the cascode circuit 50 is shown as including a first n-channel JFET input amplifier stage 51; a second n-channel JFET transistor 54 used as a cascode element; and a current divider circuit represented by reference numeral 60. The gate electrode of JFET 51 is connected to the circuit input $E_i$ represented by reference numeral 52 and the source electrode of JFET 51 is coupled directly to ground. The drain of JFET 51 is connected to node 53 and node 53 is connected directly to the source electrode of the JFET 54 cascode element. The gate electrode of the JFET 54 is connected directly to the positive terminal of the source of potential $V_b$ 55 whose negative terminal is connected directly to ground. The drain electrode of JFET 54 is connected to lead 59.

The current divider circuit 60 includes a first PNP bipolar transistor 56 and a second PNP bipolar transistor 57 configured as a current mirror. The current mirror circuit 60 has the base electrode of the first transistor 56 directly coupled to the base electrode of the second transistor 57 and the base electrodes are commonly coupled by a lead 58 to lead 59 at the drain electrode of JFET 54. Node 53 at the source of JFET 54 is directly connected to the collector electrode of the transistor 57 and the emitter electrodes of the first and second bipolar transistors 56, 57 are commonly coupled together at node 62 and connected via output lead 63 to the circuit output $E_o$ designated by reference numeral 64 and is also connected through a load resistor 65 to a source of potential V+ designated by reference numeral 66.

It will be noted that the current mirror ratio is set at n:1 and the respective current in leg 59 is given by $I_d/(n+1)$ whereas the current in the second leg 61 is given by the equation $nI_d/(n+1)$. The current mirror 60 represents a current diversion or current divider circuit which diverts or bypasses current around the JFET cascode element 54 without compromising the primary circuit function. By ratioing the current mirror at n:1 for current levels of n to 1 as indicated, the portion of the total current conducted by the cascode JFET 54 is significantly reduced by a factor of n+1. The great majority of the current can be carried through the feedback path formed of lead 61 and the second PNP bipolar transistor 57 which is represented by the equation $nI_d/(n+1)$ or "n" times as great as the current flowing through the cascode JFET 54.

Simultaneously, the noise performance is virtually unaffected by the addition of the described current divider or diverter circuit 60 because the noise sources of the added bipolar transistors 56 and 57 result in a noise signal on the gate-drain junction of the input JFET 51 but the very high output resistance of the JFET 51 prevents any significant change in the current supplied to the load resistor 65 so that the cascode circuitry including JFET 54 and the associated current mirror circuit 60 remain virtually noiseless.

In addition to setting a ratio in the current mirror circuit 60, ratioing of the mirror or any similar current divider or diverter circuit can be achieved by emitter area scaling; by the addition of ratioed emitter degeneration resistors 91 and 92, or both. In fact, in the extreme case, the first bipolar transistor 56 can be replaced with a simple resistor and sufficient current diversion retained for proper circuit operation.

Another advantage of combining the various types of current diverters or dividers such as the current mirror 60 with a JFET cascode element can be realized in the ease of biasing the circuit. FIG. 3 shows the cascode element 54 biased from the source of bias potential $V_b$ to assure adequate drain-source voltage for the JFET amplifier stage element 51. However, by sufficient reduction of the relative current levels in the cascode JFET 54, the gate-source voltage of JFET 54 can be raised to such a level that it alone provides adequate voltage across the amplifier JFET 51 for biasing the same.

Figure 4:
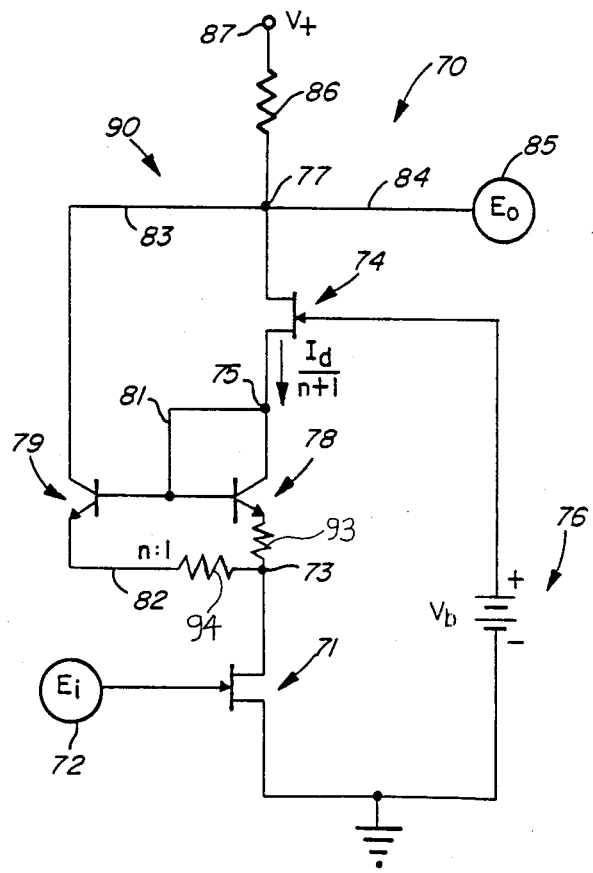
FIG. 4 is a second modified cascode circuit including a JFET input stage, a JFET cascode element, and a current mirror-like circuit operatively coupled therebetween.

An alternate embodiment of the circuit of FIG. 3 is represented by the second modified cascode circuit 70 of FIG. 4 which includes a first n-channel JFET amplifier input stage 71; a second n-channel JFET cascode element 74; and a current divider circuit 90 represented by a current mirror-like circuit or any similar current divider, current sources, or current splitting means. The input amplifier JFET 71 has its gate electrode connected directly to the circuit input $E_i$ designated by reference numeral 72 and its source electrode connected directly to ground. The drain electrode of JFET 71 is connected directly to node 73. The second JFET 74 has its gate electrode directly connected to the positive terminal of a source of potential $V_b$ designated by reference numeral 76 and whose negative terminal is connected directly to ground. The source of JFET 74 is connected directly to node 75 and the drain of JFET 74 is connected directly to node 77. The current mirror-like circuit or current divider means represented by circuit 90 is operatively coupled between the input JFET 71 and the cascode JFET 74 as described hereinafter.

The current mirror-like circuit 90 includes a first NPN bipolar transistor 78 and a second NPN bipolar transistor 79. The base electrode of transistor 78 is directly coupled to the base electrode of transistor 79 and the commonly coupled base electrodes are connected via lead 81 to node 75 at the junction of the source of JFET 74 and the collector of the first bipolar transistor 78. The emitters of the first and second bipolar transistors 78, 79 are commonly coupled together via lead 82 to node 73 at the junction of the emitter of the first bipolar transistor 78 and the drain of the first JFET 71. The collector of the second bipolar transistor 79 is connected via lead 83 to node 77. Node 77 is connected via output lead 84 to the circuit output voltage $E_o$ which is designated by reference numeral 85. Furthermore, reference node 77 is connected to one terminal of a load resistor 86 whose opposite terminal is connected to a source of potential V+ which is represented by the reference numeral 87.

The current mirror-like circuit 90 is similarly ratioed at n:1 so that the current flowing through the cascode JFET 74 is given by $I_d/(n+1)$ while the current flowing through the opposite leg and bypassing the JFET 74 is given by the equation $nI_d/(n+1)$ so that the current bypassing the JFET 74 is approximately n times as great as that flowing through the JFET 74. This enables the cascode circuit to be maintained in a noise-free mode of operation while reducing the die area required for implementing the JFET cascode element 74 in a monolithic integrated circuit to within realistic limits.

Furthermore, as indicated previously, the current mirror-like circuit 90 may be similarly replaced with any type of conventional current divider, current diverter, current bypass, multiple current source, or current splitter circuit means which is capable of significantly reducing the current through the JFET 74 without altering the circuit function. Furthermore, various means of scaling or ratioing the circuits can be used such as emitter area scaling, the addition of ratioed emitter degeneration resistors 93 and 94, or both. Again, as with FIG. 3, the ease of biasing the circuit is greatly increased with the use of the current mirror-like circuit 90 to the point where the gate-source voltage of the JFET 74 alone can be raised to such a level that it can provide adequate voltage for biasing the JFET amplifier 71.

Other variations on the illustrated circuits shown in FIGS. 2-4 are also possible. Particularly, the current divider means of circuits 3 and 4 represented by the current mirror 60 of FIG. 3 and the current mirror-like circuit of FIG. 90 may be replaced with similarly functioning circuits employing current mirrors, current dividers, current sources, current splitters, and the like such as those previously known in the art. A sampling of which may be represented by the current mirrors, current sources, current dividers, current splitters, and similar circuits shown in *THE ART OF ELECTRONICS*, Horowitz and Winfield Hill, Cambridge University Press, New York, N.Y. 1980 which is incorporated by reference herein. Further, any of the variety of field effect transistors, as produced in NMOS, CMOS, etc. can replace the JFET cascode elements illustrated.

Additionally, the circuits illustrated have been shown only with an n-channel junction field effect transistor as the amplifier element but, with the techniques described herein, it can also be applied to various other input amplifier devices as well including multiple input amplifier stages and the like. Further, the present teachings can be extended directly to differential stages, to differential amplifier stages, to multiple stages, and the like, as known in the art.

With this detailed description of the specific apparatus used to illustrate the preferred embodiment of the present invention and various alternate embodiments thereof, including the method and operation thereof, it will be obvious to those skilled in the art that various modifications can be made in the circuit of the present invention and particularly in the number of stages to which the invention is applied, to the type of input amplifier device used, to the particular type of current divider means used, and to the method of ratioing used, to the number of stages used, and in the general circuits of the present invention without departing from the spirit and scope thereof which is limited only by the appended claims.

We claim:

1. A virtually noise-free cascode amplifier circuit having an output impedance and capable of being implemented in realistic die areas in monolithic integrated circuits, comprising:
   an input JFET transistor amplifier stage for controlling current through said output impedance;
   JFET cascode means operatively coupled between said input JFET transistor amplifier stage and said circuit output impedance for substantially eliminating circuit noise; and
   means for diverting the majority of the circuit current flowing through the input JFET transistor amplifier stage and said output impedance around said JFET cascode means for significantly reducing the size of the die area required to implement the cascode JFET in a monolithic integrated circuit.

2. The cascode amplifier circuit of claim 1 wherein said diverting means includes a current mirror operatively coupled in feedback with said cascode FET.

3. The cascode amplifier circuit of claim 2 wherein said diverting means includes means for ratioing the current mirror for current levels of n to 1 such that the portion of total current conducted by the cascode JFET is reduced by a factor of n+1.

4. The cascode amplifier circuit of claim 3 wherein said means for ratioing includes means for emitter area scaling.

5. The cascode amplifier circuit of claim 3 wherein said means for ratioing includes ratioed emitter degeneration resistive means.

6. The cascode amplifier circuit of claim 3 wherein said means for ratioing includes both emitter area scaling means and ratioed degeneration resistors inserted in the emitter circuits.

7. The cascode amplifier circuit of claim 1 wherein said input FET transistor amplifier stage includes an N-channel FET having the gate electrode serving as the amplifier input, the source electrode operatively coupled to ground, and the drain electrode operatively coupled to the source electrode of the cascode FET;
   said cascode FET being an N-channel device and having its gate electrode operatively coupled to a source of bias potential and its drain electrode operatively coupled to said diverting means; and
   said diverting means including a current mirror having a first PNP bipolar transistor, a second PNP bipolar transistor, means for commonly coupling the emitters of said first and second bipolar transistors to said circuit output, said output impedance operatively coupled between a source of potential and the circuit output, means directly commonly coupling the base electrode of the first and second bipolar transistors, means for operatively coupling the commonly coupled base electrodes of the first and second bipolar transistors to the collector of the first bipolar transistor, means for operatively coupling the collector of the first bipolar transistor to the drain electrode of the cascode FET, and means for directly coupling the collector of the second bipolar transistor to the junction of the source electrode of the cascode FET with the drain electrode of the input amplifier FET for forming a feedback path around the cascode FET for ensuring that the majority of the circuit current bypasses the cascode JET for reducing the size of the die area required for integration.

8. The cascode amplifier circuit of claim 1 wherein said diverting means includes a current mirror-like circuit means operatively coupled in the source of the cascode FET to serve as a current divider means for splitting the current from the input FET transistor amplifier stage into at least two paths with the greater portion of the current bypassing the cascode FET to enable minimum die area realization of the cascode FET for monolithic integrated circuit implementation.

9. The cascode amplifier circuit of claim 8 wherein said diverting means includes means for ratioing the current mirror-like circuit means for current levels of n to 1 such that the portion of total current conducted by the cascode FET is reduced by a factor of n+1.

10. The cascode amplifier circuit of claim 9 wherein said means for ratioing includes emitter area scaling.

11. The cascode amplifier circuit of claim 9 wherein said means for ratioing includes ratioed degeneration resistive means operatively coupled in an emitter circuit of said diverting means.

12. The cascode amplifier circuit of claim 9 wherein said means for ratioing includes both emitter area scaling and ratioed resistive means inserted in an emitter circuits of said diverting means.

13. The cascode amplifier circuit of claim 1 wherein said input FET transistor amplifier stage includes a n-channel FET having its gate electrode serving as the circuit input, its source electrode operatively coupled to ground, and its drain electrode operatively coupled to said diverting means;

said cascode means including a n-channel FET having its gate electrode operatively biased, its drain electrode operatively coupled to the circuit output, and its source electrode operatively coupled to said diverting means; and said diverting means including a current mirror-like circuit means operatively coupled in the drain of the cascode FET to serve as a current divider means for splitting the current from the input FET, said current mirror-like circuit means including first and second NPN bipolar transistors, means for commonly coupling the bases of said bipolar transistors, means for operatively coupling the commonly coupled bases of the bipolar transistors to the collector of the first bipolar transistor, means for commonly coupling the emitters of the first and second bipolar transistor to the drain of the input FET, means for operatively coupling the collector of the first bipolar transistor to the source electrode of the cascode FET, means for coupling the collector of the second bipolar transistor to the drain electrode of the cascode FET, means for coupling the drain electrode of the cascode FET to the circuit output, and said output impedance operatively coupled between a source of potential and the circuit output.

14. A cascode circuit comprising:
an amplifier input stage for controlling current therethrough;
a load impedance for receiving current from said amplifier input stage;
a JFET cascode means for substantially eliminating all circuit noise; and
a current divider means for diverting a majority of the current passing through said amplifier input stage and said load impedance around said JFET cascode means for reducing the die area required for implementing the JFET cascode means to a realistic size for monolithic integration circuit implementation.

15. The cascode circuit of claim 14 wherein said amplifier input stage includes an n-channel FET amplifier means.

16. The cascode circuit of claim 14 wherein the said current division means includes a current mirror, said current mirror being operatively coupled in feedback relationship with the cascode FET for diverting the majority of the current around the cascode FET thereby substantially reducing the die area required for implementing the cascode JFET in a monolithic integrated circuit.

17. The cascode circuit of claim 16 wherein said amplifier input stage includes an n-channel FET, the gate electrode of said FET serving as the circuit input, the source electrode being operatively coupled to ground, and the drain electrode being operatively coupled to the source electrode of the cascode JFET;

the cascode FET including a n-channel device, a gate electrode being operatively biased and the drain electrode being operatively coupled to the current mirror; and the current mirror including first and second PNP bipolar transistors, means for operatively coupling the base electrodes of the first and second bipolar transistors together, means for operatively coupling the commonly coupled base electrodes of the bipolar transistors to the collector of the first bipolar transistor, means for operatively coupling the collector of the first bipolar transistor to the drain electrode of the cascode FET, means for operatively coupling the collector electrode of the second bipolar transistor to the junction of the source electrode of the cascode JFET and the drain electrode of the input FET, means for commonly coupling the emitter electrodes of the first and second bipolar transistors to the circuit output, and wherein said load impedance is means operatively coupled between a source of potential and the circuit output.

18. The cascode circuit of claim 14 wherein said current divider means includes a current mirror-like means operatively coupled in the source of the cascode FET to serve as a current divider means for splitting the current from the amplifier input stage into at least two paths with the greater portion of the current bypassing the cascode FET to enable a minimum die area to be used for implementing the cascode FET in a monolithic integrated circuit.

19. The cascode circuit of claim 14 wherein said current divider means includes current source means for diverting a majority of the current around the cascode FET.

20. The cascode circuit of claim 14 wherein said current divider means includes current splitter means for dividing the current path from the amplifier input stage into at least two separate paths with the majority of the current bypassing the cascode FET to enable the cascode FET to be implemented in a realistic amount of die area by monolithic integration circuit techniques.

21. The cascode circuit of claim 14 wherein said current divider means includes means for ratioing the current divider means for current levels of n to 1, the portion of the total current conducted by the cascode FET being reduced by a factor of n+1.

22. The cascode circuit of claim 21 wherein said means for ratioing includes emitter area scaling.

23. The cascode circuit of claim 21 wherein said means for ratioing includes ratioed emitter degenerative resistors operatively coupled in the current divider means for controlling the proper division of current to ensure that the majority thereof bypasses said cascode FET.

24. The cascode circuit of claim 21 wherein said means for ratioing includes both the use of emitter area scaling and the use of ratioed emitter degenerative resistive means operatively coupled in said circuit divider means to ensure that the majority of amplifier input current bypasses the cascode FET.

25. The cascode circuit of claim 14 further including means for reducing the current level in the cascode FET to a point where the gate-source voltage of the cascode FET itself can be raised to a level such that it alone provides adequate voltage across the amplifier device to eliminate the need for external biasing.

26. A cascode circuit comprising:
   an amplifier input stage;
   a JFET cascode means for substantially eliminating all circuit noise; and
   a current divider means for diverting the majority of the circuit current passing through said amplifier input stage around said JFET cascode means for reducing the die area required for implementing the JFET cascode means to a realistic size for monolithic integration circuit implementation;
   wherein said current divider means includes a current mirror-like means operatively coupled as a current source for the cascode JFET means to serve as a current divider means for splitting the current from the amplifier input stage into at least two paths with the greater portion of the current bypassing the cascode JFET means to enable a minimum die area to be used for implementing the cascode JFET means in a monolithic integrated circuit;
   wherein said amplifier input stage includes an n-channel JFET having the input signal applied to the gate electrode thereof, the source electrode being operatively coupled to ground, and the drain electrode being operatively coupled to said current mirror-like circuit;
   the cascode JFET means including a n-channel JFET device, its gate electrode being operatively biased, its drain electrode being coupled to the circuit output, and its source electrode being operatively coupled to said current mirror-like circuit; and
   said current mirror-like circuit including a first and second NPN bipolar transistors, the base electrodes of the first and second bipolar transistors being commonly coupled together, means for operatively connecting the commonly coupled base electrodes of the first and second bipolar transistors to the collector of the first bipolar transistor, means for commonly coupling the emitter electrodes of said first and second bipolar transistors to the drain electrode of the JFET input amplifier, means for operatively coupling the collector of the first bipolar transistor to the source electrode of the cascode JFET means, for operatively coupling the collector electrode of the second bipolar transistor to the drain electrode of the cascode JFET means, and a load resistor operatively coupled between a source of potential and the circuit output.

27. In an improved cascode circuit including an amplifier stage, a circuit input to the amplifier stage, and a circuit output impedance, a cascode element operatively coupled between the amplifier stage and the circuit output impedance, the improvement comprising, in combination:
   said cascode element including an n-channel JFET transistor means for eliminating substantially all circuit noise; and
   a current divider means for bypassing the majority of the current through said amplifier stage past the JFET cascode element to the load impedance for enabling the circuit to be implemented by monolithic integrated circuit techniques without the use of unreasonable die areas thereby enabling the production of a noise-free integrated cascode circuit.

28. The improved cascode circuit of claim 27 wherein said current divider means includes a current mirror operatively coupled in feedback relationship with the cascode FET for bypassing the majority of the current from the amplifier stage to bypass the FET cascode element to enable the integration thereof.

29. The improved cascode circuit of claim 28 wherein the current divider means includes means for ratioing the current mirror for current levels of n to 1 such that the portion of total current conducted by the cascode FET is reduced by a factor of n+1.

30. The improved cascode circuit of claim 27 wherein said current dividing means includes a current mirror-like circuit operatively coupled as a current source for the cascode FET to serve as a current divider for splitting the current from the input FET into two paths with the greater portion of the current bypassing the cascode FET to enable minimum die areas possible thereby enabling monolithic integration cascode circuit implementation.

31. The improved cascode circuit of claim 30 wherein said current divider means further includes means for ratioing the current mirror-like circuit for current levels of n to 1 such that the portion of total current conducted by the cascode FET is reduced by a factor of n+1.

32. The improved cascode circuit of claim 27 wherein the current divider means further includes current source means for dividing the current so that the majority thereof bypasses the cascode FET so as to enable the cascode FET to be implemented in a monolithic integrated circuit.

33. The improved cascode circuit of claim 27 wherein the current divider means includes current splitter means for operatively dividing the current passing through the amplifier stage so that a majority thereof bypasses the cascode JFET thereby enabling the cascode FET to be implemented in a monolithic integrated circuit.

* * * * *